United States Patent
Tamrazyan et al.

(10) Patent No.: US 12,278,639 B1
(45) Date of Patent: Apr. 15, 2025

(54) WIDE FREQUENCY RANGE BURST MODE CLOCK AND DATA RECOVERY CIRCUIT USING CLOCK TO DATA DELAY COMPENSATION METHOD

(71) Applicant: Faraday Technology Corp., Hsin-Chu (TW)

(72) Inventors: Mikhail Tamrazyan, Hsin-Chu (TW); Vinod Kumar Jain, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 53 days.

(21) Appl. No.: 18/380,635

(22) Filed: Oct. 16, 2023

(51) Int. Cl.
  *H03D 3/24* (2006.01)
  *H03L 7/08* (2006.01)
  *H03L 7/091* (2006.01)
  *H03L 7/093* (2006.01)

(52) U.S. Cl.
  CPC ............ *H03L 7/0807* (2013.01); *H03L 7/091* (2013.01); *H03L 7/093* (2013.01)

(58) Field of Classification Search
  CPC ..... H04L 7/033; H04L 27/033; H04L 27/389; H03L 7/0891; H03L 7/093; H03L 7/09; H03L 7/24; H03D 3/007
  USPC ........ 375/376, 371, 373, 375; 455/103, 127; 327/156
  See application file for complete search history.

(56) References Cited

U.S. PATENT DOCUMENTS

| | | | |
|---|---|---|---|
| 8,030,964 B1 * | 10/2011 | Shih | H03K 19/018521 326/68 |
| 11,356,107 B1 * | 6/2022 | Bhat | H03L 7/085 |
| 11,405,043 B1 * | 8/2022 | Grave | H03K 5/15046 |
| 2008/0111634 A1 * | 5/2008 | Min | H03L 7/099 331/10 |
| 2018/0013435 A1 * | 1/2018 | Namkoong | H03L 7/0995 |
| 2021/0152180 A1 * | 5/2021 | Shin | H04L 27/00 |

* cited by examiner

*Primary Examiner* — Khai Tran
(74) *Attorney, Agent, or Firm* — Winston Hsu

(57) ABSTRACT

A clock and data recovery (CDR) circuit includes: a frequency tracking loop including an injection locked oscillator for adjusting a frequency of oscillation to generate an output signal having a frequency tracked to a reference clock frequency, and then receiving an input data signal and extracting an output clock from the input data signal; and a phase tracking circuit coupled to the frequency tracking loop. The phase tracking circuit includes: a phase interpolator for receiving the output clock and adjusting a phase of the output clock according to an input code to generate a sampling clock for sampling a signal to generate a deserialized signal; and a finite state machine, coupled to the phase interpolator, for outputting a code to the phase interpolator according to the deserialized signal of the multiplexer in order to adjust the phase of the output clock.

14 Claims, 4 Drawing Sheets

WIDE FREQUENCY RANGE BURST MODE CLOCK AND DATA RECOVERY CIRCUIT USING CLOCK TO DATA DELAY COMPENSATION METHOD

BACKGROUND OF THE INVENTION

1. Field of the Invention

This invention is directed to Clock and Data Recovery (CDR) circuits, and more particularly, to a CDR circuit which can achieve a fast lock over a wide range of frequencies.

2. Description of the Prior Art

Passive Optical Networks (PONs) are fibre-optics communications technology, wherein a single optical fibre can provide broadband network access from a central office node known as an optical line terminal (OLT) to multiple end-users known as optical network units (ONUs). The network is called a passive network as there are no power requirements or active electronic parts to transmit the signal across the network. The data is usually transmitted across the network in bursts using high speed serial links. As the data is transmitted without an accompanying clock, a clock must be extracted from the serial data for use in further processing.

PONs therefore employ clock and data recovery (CDR) circuits to extract a clock from the burst data, which is then used to lock to the data. Traditional CDR architectures require hundreds of unit intervals (UI) to thousands of UI to achieve lock, but burst data requires lock to be achieved within tens of UI to maintain errorless operation.

In order to solve this issue, burst mode CDRs have been proposed. Burst mode CDRs have separate frequency tracking loops comprising Gated Voltage Control Oscillators (GVCOs). Clock and data recovery is achieved in two steps, wherein the first step tracks the frequency of the clock and the second step achieves phase lock between the clock and the data. This related art burst mode CDR can achieve fast locking times to meet the requirements of the OLT specification, but they have a limited control range which does not support a wide range of data rates.

Phase Interpolator (PI) based CDRs are also burst mode based but they use an external CLK which is already locked to a target frequency, such that a separate frequency tracking loop is not required. Phase lock is achieved via state machines for phase tracking. The PI based CDRs can support a wide range of frequencies, but even the fastest of state machines require hundreds of UI to achieve phase lock.

It is therefore necessary to develop a CDR which can support a wide range of frequencies and is also able to achieve fast locking times, such that requirements of PONs and OLTs can be met.

SUMMARY OF THE INVENTION

With this in mind, the present invention provides a circuit and a method for performing clock and data recovery.

A clock and data recovery (CDR) circuit according to an exemplary embodiment of the present invention comprises: a frequency tracking loop for generating an output signal frequency locked with a reference clock, comprising: an injection locked oscillator, for receiving a voltage control signal generated according to the reference clock, and adjusting a frequency of oscillation to generate an output signal having a frequency tracked to the reference clock frequency, and then receiving an input data signal and extracting an output clock from the input data signal; and a phase tracking circuit coupled to the frequency tracking loop. The phase tracking circuit comprises: a phase interpolator, coupled to the injection locked oscillator, for receiving the output clock and adjusting a phase of the output clock according to an input code to generate a sampling clock for sampling a signal to generate a deserialized signal; and a finite state machine, coupled to the phase interpolator, for outputting a code to the phase interpolator according to the deserialized signal of the multiplexer in order to adjust the phase of the output clock. The phase tracking circuit further comprises: a multiplexer, coupled to the finite state machine, having a first input for receiving a clock signal, and a second input for receiving data, wherein when a select data signal input to the multiplexer is low, the multiplexer outputs the clock signal to the finite state machine.

The CDR circuit further comprises a high-gain low jitter amplifier coupled between the multiplexer and the injection locked oscillator, wherein when the select data signal input to the multiplexer is low, the multiplexer outputs the clock signal to the high-gain low jitter amplifier, and the high-gain low jitter amplifier amplifies the clock signal and inputs it to the injection locked oscillator as the input data signal. The high-gain low jitter amplifier is enabled by an enable signal.

The CDR circuit further comprises: a sampler coupled between the multiplexer and the phase interpolator, for receiving the clock signal and sampling it according to the sampling clock; a latch, coupled between the sampler and the phase interpolator, for latching the sampled signal according to the sampling clock; and a deserializer, coupled between the latch and the finite state machine, for deserializing the latched signal and outputting the deserialized signal to the finite state machine. The finite state machine generates a code to the phase interpolator according to a sign of the deserialized signal for adjusting a phase of the output clock in a first direction with respect to the deserialized signal, wherein when a sign of the deserialized signal changes, the code is saved as a first code, and the finite state machine then generates a code to the phase interpolator according to a sign of the deserialized signal for adjusting a phase of the output clock in a second direction with respect to the deserialized signal, wherein when a sign of the deserialized signal changes, the code is saved as a second code, and generates a final code being a sum of the first code and the second code divided by two. When the select data signal is high, the multiplexer outputs the second input and the phase interpolator adjusts a phase of the output clock from the injection locked oscillator according to the final code.

The frequency tracking loop further comprises: a frequency detector, for receiving a reference clock and a clock pair, and generating up or down signals according to a frequency comparison between the reference clock and the clock pair; a charge pump coupled to the frequency detector, for generating a voltage control signal to the injection locked oscillator according to the up or down signals; a low-pass filter coupled between the injection-locked oscillator and the phase interpolator, for low-pass filtering the extracted output clock; and a divide by N feedback divider, coupled between the low-pass filter and the frequency detector, for generating the clock pair according to the output clock.

A method for performing clock and data recovery (CDR) circuit comprises: generating a voltage control signal according to a reference clock; adjusting a frequency of an oscillator according to the voltage control signal to generate an output signal having a frequency tracked to the reference clock frequency; receiving an input data signal and utilizing the oscillator to extract an output clock from the input data signal; sampling the input data signal to generate a deserialized signal according to a sampling clock; generating a code according to the deserialized signal; and adjusting a phase of the output clock according to the code to generate the sampling clock.

The step of receiving the input data signal further comprises: outputting a clock signal when a select data signal is low; and amplifying the clock signal to generate the input data signal. The method further comprises: sampling the clock signal according to the sampling clock; latching the sampled signal according to the sampling clock; and deserializing the latched signal to generate the deserialized signal.

The step of generating a code according to the deserialized signal comprises: generating a code according to a sign of the deserialized signal for adjusting a phase of the output clock in a first direction with respect to the deserialized signal; when a sign of the deserialized signal changes, saving the code as a first code; generating a code according to a sign of the deserialized signal for adjusting a phase of the output clock in a second direction with respect to the deserialized signal; when a sign of the deserialized signal changes, saving the code as a second code; and generating a final code being a sum of the first code and the second code divided by two.

The step of generating the voltage control signal comprises: receiving the reference clock and a clock pair; generating up or down signals according to a frequency comparison between the reference clock and the clock pair; low-pass filtering the extracted output clock; dividing the extracted output clock by N to generate the clock pair; and generating the voltage control signal to the injection locked oscillator according to the up or down signals. When the select data signal is high, the method further comprises: outputting a data signal; and adjusting a phase of the output clock according to the final code.

These and other objectives of the present invention will no doubt become obvious to those of ordinary skill in the art after reading the following detailed description of the preferred embodiment that is illustrated in the various figures and drawings.

DETAILED DESCRIPTION

In order to solve the problems of the related art, a burst mode CDR is proposed which employs a frequency tracking loop comprising an injection locked voltage control oscillator (ILO). Phase locking is achieved via a phase interpolator (PI) and finite state machine (FSM) during a training phase. In this way, the burst mode CDR of the present invention can support a wide range of frequencies while being able to achieve phase lock in less than 40 UIs.

Figure 1:
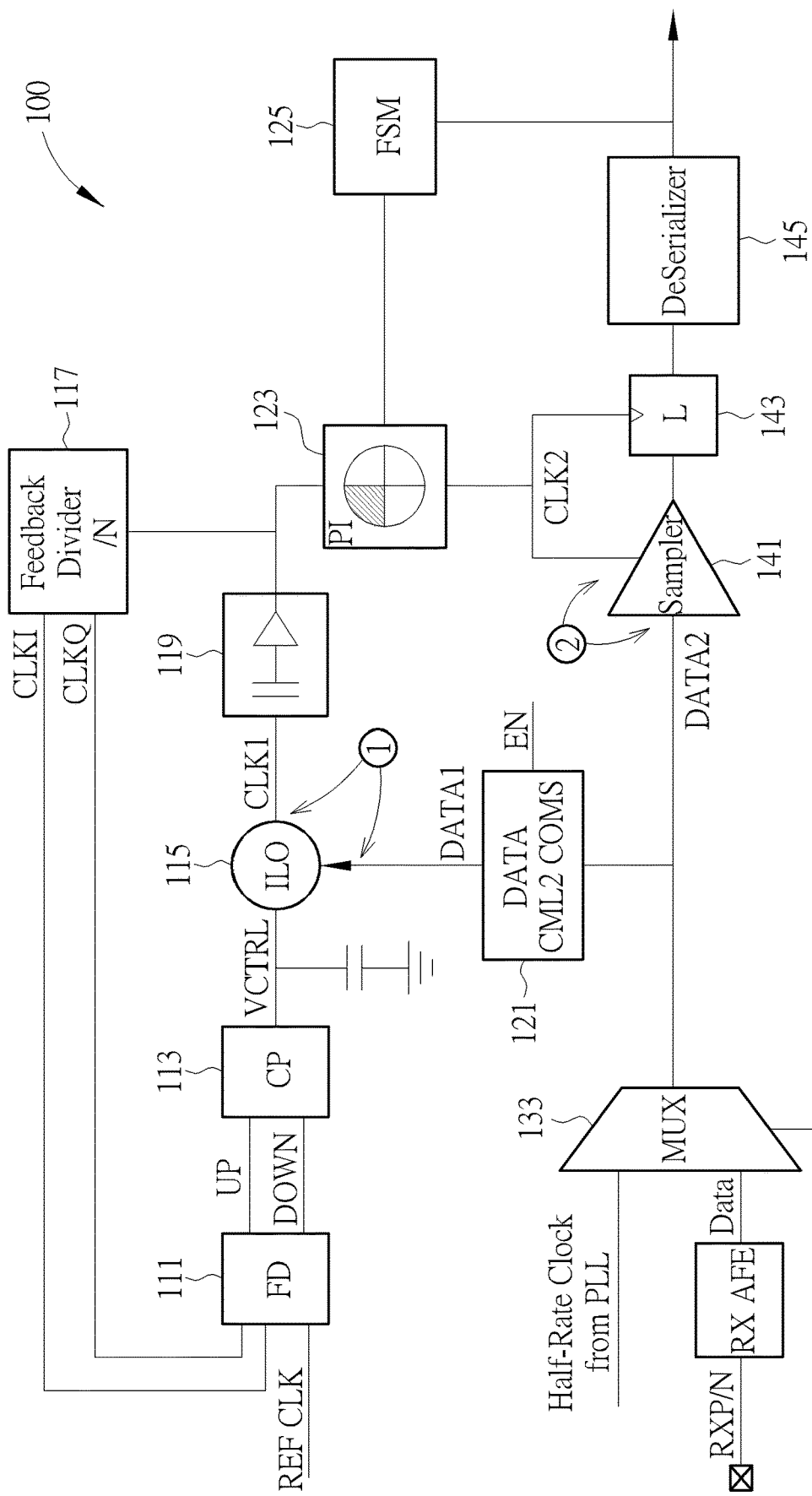
FIG. 1 is a diagram of a clock and data recovery circuit according to an exemplary embodiment of the present invention.

Refer to FIG. 1, which is a diagram of a CDR 100 according to an exemplary embodiment of the present invention. As shown in the diagram, the CDR 100 employs a separate frequency tracking loop comprising a frequency detector (FD) 111, a charge pump (CP) 113, the above-mentioned ILO 115, an RC low-pass filter 119, and a divide by N feedback divider 117.

The frequency tracking loop is used to track a frequency of extracted data with respect to that of a reference clock. Initially, only the reference clock is input to the frequency tracking loop, i.e. the enable signal input of a high gain low jitter amplifier (DATA CML2CMOS) 121, coupled to the ILO 115, is low. The FD 111 receives the reference clock which can be generated by an external phase locked loop (PLL), as well as a clock pair CLKI, CLKQ from the divide by N feedback divider 117. By comparing frequency of the reference clock with the clock pair, up or down signals representing the difference in frequency are generated to the CP 113. According to these signals, the CP 113 then outputs a voltage control signal VCTRL which represents this frequency difference to the ILO 115. VCTRL will control the oscillation frequency of the ILO 115 so that it tracks with the frequency of the reference clock. While the enable signal input to the amplifier 121, the frequency tracking loop operates independently.

During a training mode, the enable signal input to the amplifier 121 goes high, such that data injected to the ILO 115 will be a half-rate clock input to a MUX 133 of the CDR 100. A clock signal CLK 1 is extracted from the data DATA 1, and is propagated through the frequency tracking loop. VCTRL controls the oscillation frequency of the ILO 115 in order to make the phase of the extracted clock match that of the reference clock. The clock CLK 1 is passed through the RC low-pass filter 119, and sent to the divide by N feedback divider 117 as well as a phase interpolator (PI) 123.

As is well-known, an injection locked oscillator consists of a number of delay stages as in a ring oscillator, wherein a capacitor is coupled between two of the delay stages. Data is injected to the capacitor, and a control signal representing a frequency of a reference clock is input to a previous delay stage. The output of the delay stage will be an oscillating signal. The aim is to achieve phase lock between the injected data and the extracted clock. When the data is injected to the capacitor, the output of the capacitor will be a short pulse which shorts the output of the previous delay stage, such that phase of the oscillating signal is moved to align with the data. The phase locking is therefore very fast.

The bottom half of the CDR 100 comprises a MUX 133, which receives the half-rate clock signal from a PLL (which may be the same PLL which provides the reference clock to the frequency tracking loop or a different PLL), and a receiver (Rx) analog front end (AFE) circuit 131, which receives RXP/N signals and outputs them as data to the MUX 133. A select data signal is input to the MUX 133. When the select data signal=0, the half-rate clock will be output (i.e. during a training mode), and when select data=1, the data will be output (i.e. during normal operation). The output of the MUX 133 is input to the high gain low jitter amplifier circuit 121. When the enable signal is high, the amplifier 121 amplifies the data signal to be injected into the ILO 115. When the enable signal is low, only the frequency tracking loop will operate. The amplifier 121 is used because data will undergo some loss during propagation through a circuit, and may not be able to effectively short the outputs of delay stages within the ILO 115 unless it is amplified.

As shown in FIG. 1, the data received at the ILO 115 is DATA 1 and the extracted clock thereof is CLK 1. These two are indicated by point 1 in the diagram. CLK 1 is used to sample and latch data for being deserialized and output. This sampling and latching is performed by, respectively, a sampler (sense amplifier) 141 and a latch 143, which both receive the extracted clock signal as an input. The sampled data is then sent to a deserializer 145. Due to propagation delay, however, the data received at the sampler 141 (DATA 2) is delayed with respect to DATA 1, and the clock signal (CLK 2) at this point (point 2 in the diagram) is delayed with respect to CLK 1. Moreover, the extracted clock CLK 2 will be out of phase with DATA 2.

Figure 2:
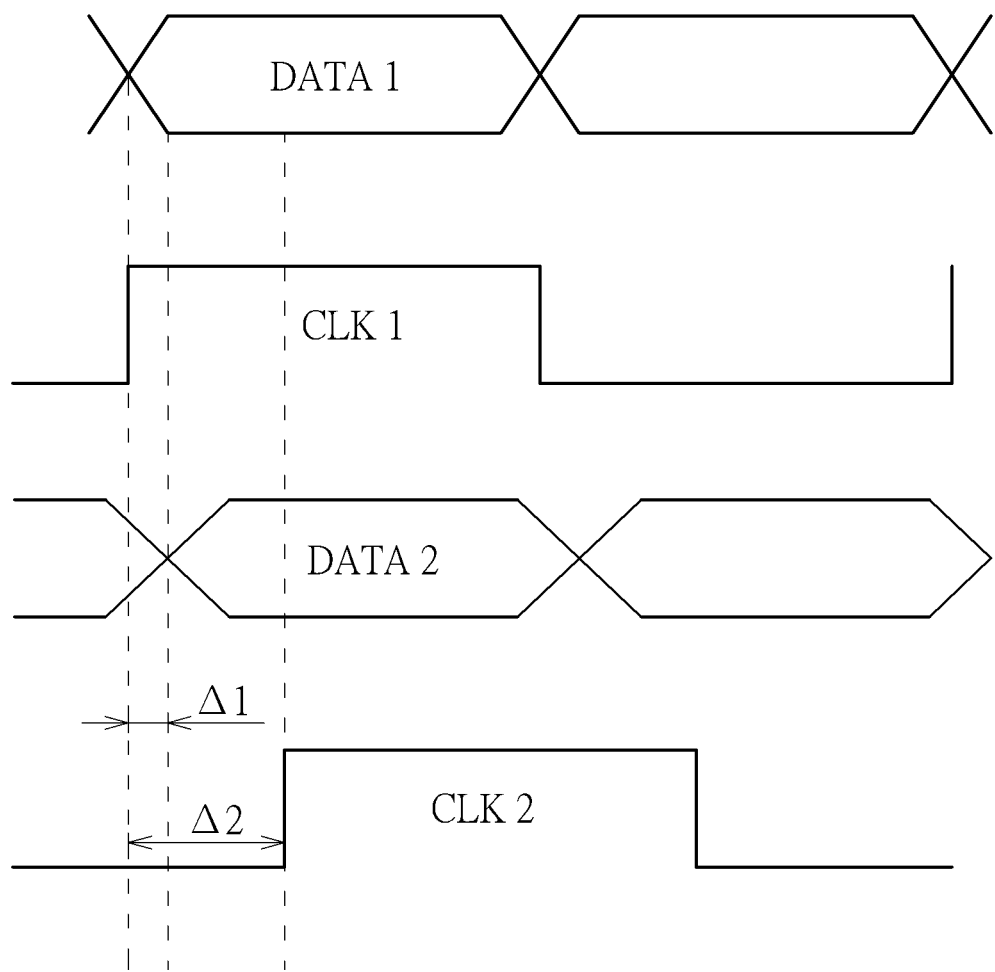
FIG. 2 is a diagram of a phase relationship between a first clock signal, a first data signal, a second clock signal and a data signal before phase locking.

FIG. 2 shows the relative phases of DATA 1, CLK 1, DATA 2 and CLK 2. $\Delta 1$ is the delay between the beginning of DATA 1 and the beginning of DATA 2. $\Delta 2$ is the delay between the beginning of DATA 1 and the rising edge of CLK 2. As $\Delta 2$ is not known, it is difficult to directly perform phase lock of DATA 2 with CLK 2. The CDR circuit 100 therefore employs a Phase Interpolator (PI) 123 and a Finite State Machine (FSM) 125. The PI 123 and FSM 125 are used to shift CLK 2 with respect to DATA 2 in order to find two edges of the data. In order to obtain maximum timing margins, the receiver should be in the center of the eye pattern of the data bits sampled; in other words, the clock edge with respect to the position of data bits determines the performance of the link.

The PI 123 receives CLK 1 from the RC low pass filter 119, which is input to the sampler 141 and latch 143 as CLK 2 due to the propagation delay. The FSM receives deserialized data from the deserializer, i.e. ZEROES or ONES. The FSM 125 works by entering a CTRL input code which delays a clock at the PI 123 output. The delay amount is determined by equation T0+Tp/Ns, wherein Tp is the clock period, and Ns is the number of steps for controlling the PI. Both edges of the Data 2 signal need to be found: Edge 1 corresponds to a beginning of the data and Edge 2 corresponds to an end of the data. The FSM 125 changes a code of the PI 123 to shift CLK 2 left or right in order to find the two data edges, which can be determined according to an output of the deserializer 145. If a rising edge of the clock signal occurs while the data signal is high, the deserializer 145 will output ONES. When an edge of the data is reached, the sampled signal will shift between ZEROES and ONES due to jitter. When CLK 2 is shifted further in the same direction, the sampled signal will become ZEROES only as the data signal is low, i.e. the edge has already been reached. Therefore, according to the output of the deserializer 145, the FSM 125 can know whether an edge of the data has been reached, and save a corresponding code which shifts CLK 2 to align with said edge when input to the PI 123.

Figure 4A:
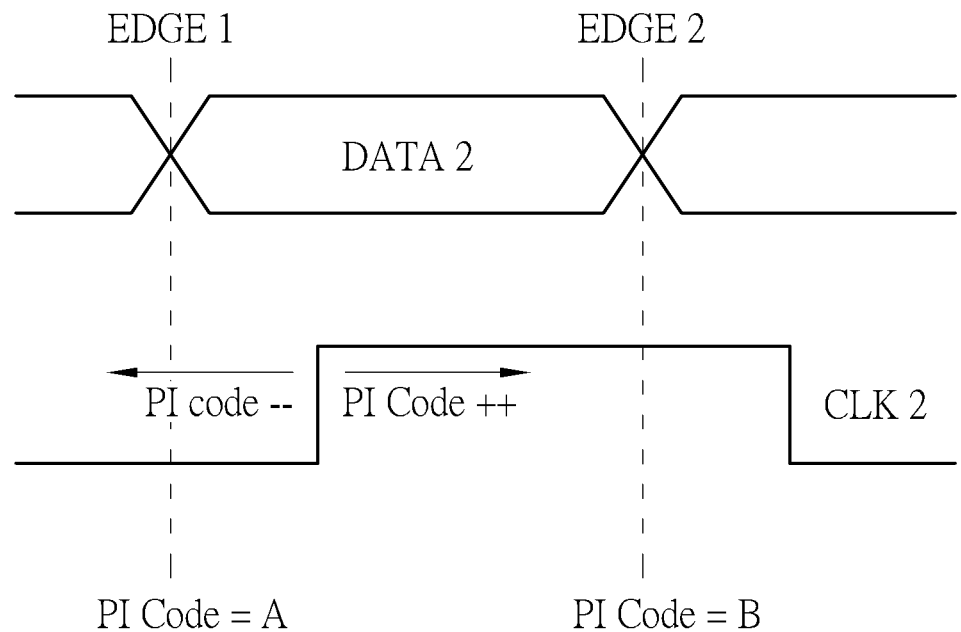
FIG. 4A is a diagram of determining a first edge and a second edge of the second data signal according to the second clock signal.
Figure 4B:
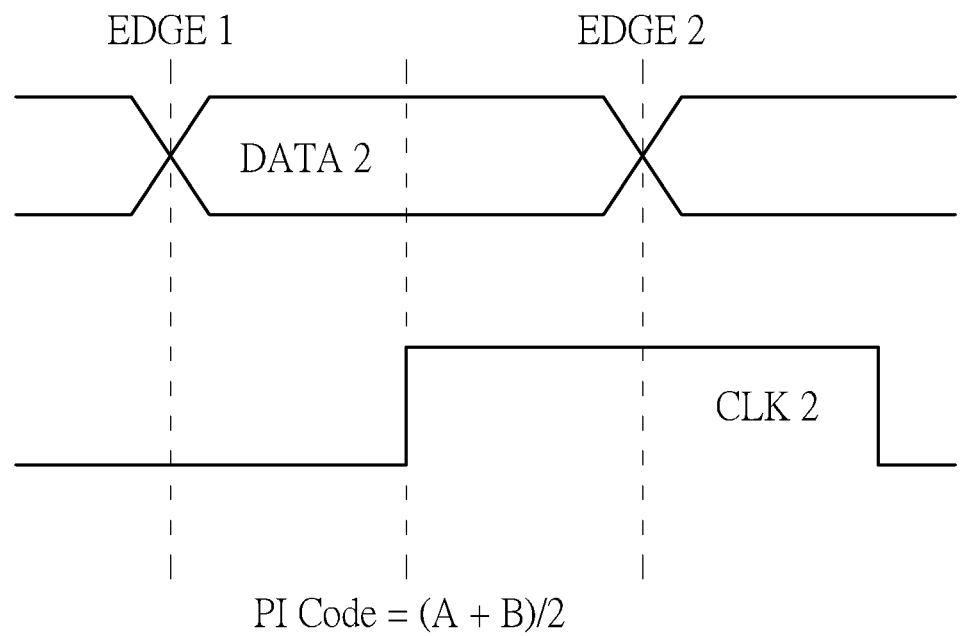
FIG. 4B is a diagram of the second clock signal and second data signal shown in FIG. 4A after phase lock has been achieved.

FIG. 4A and FIG. 4B illustrate how the PI input Code from the FSM 125 shifts CLK 2 with respect to DATA 2 to find both edges of the data, and how a resultant code is generated that can fix a rising edge of CLK 2 to be in the centre of the data eye of DATA 2. FIG. 4A illustrates how the edges of DATA 2 are found with respect to the rising edge of CLK 2. The FSM 125 inputs a code 'PI code--' which shifts CLK 2 to the left until Edge 1 is found, as detailed above. The PI code at this point is saved as PI Code=A. Then, CLK 2 is shifted to the right by the FSM 125 inputting a code 'PI code++' until Edge 2 is found. The PI code at this point is saved as PI Code B.

The ideal is to lock CLK 2 at the middle of DATA 2; therefore, the desired PI Code is (A+B)/2 and is input to the PI 123, which shifts CLK 2 so that the rising edge is directly in the centre of DATA 2. This determined code can directly be used during normal operation of the CDR circuit 100. At this point, training is finished, and the 'Select Data' input to the MUX 133 can go high such that the data from the RX AFE 131 will be output.

Figure 3:
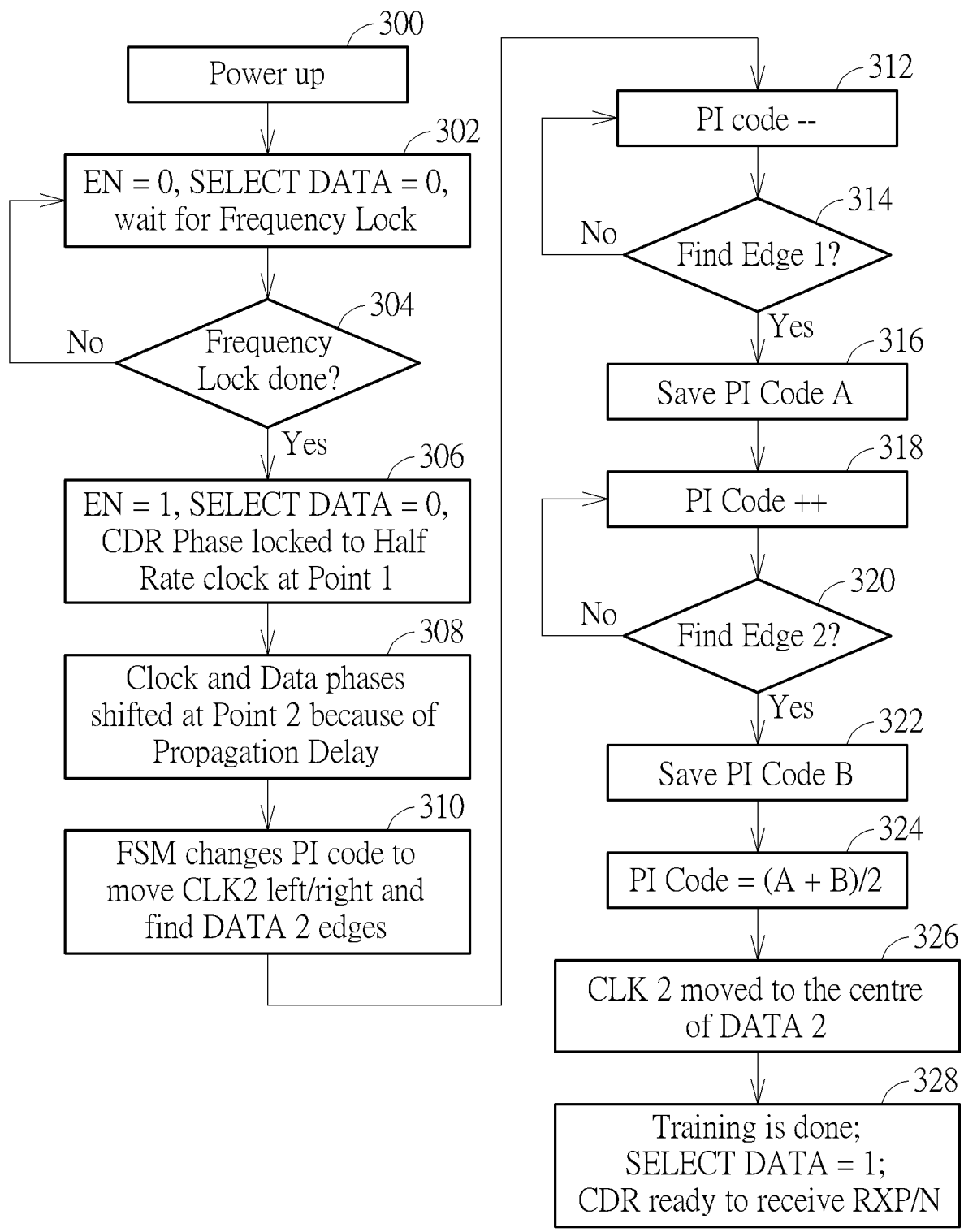
FIG. 3 is a flowchart of a method according to an exemplary embodiment of the present invention.

FIG. 3 is a flowchart illustrating the steps of the above method.

Step 300: Power up

Step 302: EN=0, SELECT DATA=0, wait for Frequency Lock

Step 304: Is Frequency Lock done? If yes, go to Step 306; if no, return to Step 302

Step 306: EN=1, SELECT DATA=0, CDR Phase locked to Half Rate clock at Point 1

Step 308: Clock and Data phases shifted at Point 2 because of Propagation Delay Step 310: FSM changes PI code to move CLK2 left/right and find DATA 2 edges Step 312: PI code--

Step 314: Is Edge 1 found? If yes, go to Step 316; if no, return to Step 312

Step 316: Save PI Code A

Step 318: PI Code++

Step 320: Is Edge 2 found? If yes, go to Step 322; if no, return to Step 318

Step 322: Save PI Code B

Step 324: PI Code=(A+B)/2

Step 326: CLK 2 moved to the centre of DATA 2

Step 328: Training is done; SELECT DATA=1; CDR ready to receive RXP/N.

By the above method and disclosed circuit, the CDR circuit 100 can extract a clock and provide fast phase locking over a wide range of frequencies, making it applicable to PON fibre-optics technology.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock and data recovery (CDR) circuit, comprising:
   a frequency tracking loop for generating an output signal frequency locked with a reference clock, comprising:
      an injection locked oscillator, for receiving a voltage control signal generated according to the reference clock, and adjusting a frequency of oscillation to generate an output signal having a frequency tracked to the reference clock frequency, and then receiving an input data signal and extracting an output clock from the input data signal; and
   a phase tracking circuit coupled to the frequency tracking loop, comprising:
      a phase interpolator, coupled to the injection locked oscillator, for receiving the output clock and adjusting a phase of the output clock according to an input code to generate a sampling clock for sampling a signal to generate a deserialized signal; and
      a finite state machine, coupled to the phase interpolator, for outputting a code to the phase interpolator according to the deserialized signal of a multiplexer in order to adjust the phase of the output clock.

2. The CDR circuit of claim 1, wherein the phase tracking circuit further comprises:

the multiplexer, coupled to the finite state machine, having a first input for receiving a clock signal, and a second input for receiving data, wherein when a select data signal input to the multiplexer is low, the multiplexer outputs the clock signal to the finite state machine.

3. The CDR circuit of claim 2, further comprising an amplifier coupled between the multiplexer and the injection locked oscillator, wherein when the select data signal input to the multiplexer is low, the multiplexer outputs the clock signal to the amplifier, and the amplifier amplifies the clock signal and inputs it to the injection locked oscillator as the input data signal.

4. The CDR circuit of claim 3, wherein the amplifier is enabled by an enable signal.

5. The CDR circuit of claim 2, further comprising:
a sampler coupled between the multiplexer and the phase interpolator, for receiving the clock signal and sampling it according to the sampling clock;
a latch, coupled between the sampler and the phase interpolator, for latching the sampled signal according to the sampling clock; and
a deserializer, coupled between the latch and the finite state machine, for deserializing the latched signal and outputting the deserialized signal to the finite state machine.

6. The CDR circuit of claim 5, wherein the finite state machine generates a code to the phase interpolator according to a sign of the deserialized signal for adjusting a phase of the output clock in a first direction with respect to the deserialized signal, wherein when a sign of the deserialized signal changes, the code is saved as a first code, and the finite state machine then generates a code to the phase interpolator according to a sign of the deserialized signal for adjusting a phase of the output clock in a second direction with respect to the deserialized signal, wherein when a sign of the deserialized signal changes, the code is saved as a second code, and generates a final code being a sum of the first code and the second code divided by two.

7. The CDR circuit of claim 1, wherein the frequency tracking loop further comprises:
a frequency detector, for receiving a reference clock and a clock pair, and generating up or down signals according to a frequency comparison between the reference clock and the clock pair;
a charge pump coupled to the frequency detector, for generating the voltage control signal to the injection locked oscillator according to the up or down signals;
a low-pass filter coupled between the injection-locked oscillator and the phase interpolator, for low-pass filtering the extracted output clock; and
a divide by N feedback divider, coupled between the low-pass filter and the frequency detector, for generating the clock pair according to the output clock.

8. The CDR circuit of claim 6, wherein when the select data signal is high, the multiplexer outputs the second input and the phase interpolator adjusts a phase of the output clock from the injection locked oscillator according to the final code.

9. A method for performing clock and data recovery (CDR) circuit, comprising:
generating a voltage control signal according to a reference clock;
adjusting a frequency of an oscillator according to the voltage control signal to generate an output signal having a frequency tracked to the reference clock frequency;
receiving an input data signal and utilizing the oscillator to extract an output clock from the input data signal;
sampling the input data signal to generate a deserialized signal according to a sampling clock;
generating a code according to the deserialized signal; and
adjusting a phase of the output clock according to the code to generate the sampling clock.

10. The method of claim 9, wherein the step of receiving the input data signal further comprises:
outputting a clock signal when a select data signal is low; and
amplifying the clock signal to generate the input data signal.

11. The method of claim 10, further comprising:
sampling the clock signal according to the sampling clock;
latching the sampled signal according to the sampling clock; and
deserializing the latched signal to generate the deserialized signal.

12. The method of claim 9, wherein the step of generating a code according to the deserialized signal comprises:
generating a code according to a sign of the deserialized signal for adjusting a phase of the output clock in a first direction with respect to the deserialized signal;
when a sign of the deserialized signal changes, saving the code as a first code;
generating a code according to a sign of the deserialized signal for adjusting a phase of the output clock in a second direction with respect to the deserialized signal;
when a sign of the deserialized signal changes, saving the code as a second code; and
generating a final code being a sum of the first code and the second code divided by two.

13. The method of claim 9, wherein the step of generating the voltage control signal comprises:
receiving the reference clock and a clock pair;
generating up or down signals according to a frequency comparison between the reference clock and the clock pair;
low-pass filtering the extracted output clock;
dividing the extracted output clock by N to generate the clock pair; and
generating the voltage control signal to the injection locked oscillator according to the up or down signals.

14. The method of claim 12, wherein when the select data signal is high, the method further comprises:
outputting a data signal; and
adjusting a phase of the output clock according to the final code.

* * * * *